(12) United States Patent
Itoh

(10) Patent No.: US 6,814,901 B2
(45) Date of Patent: Nov. 9, 2004

(54) METHOD OF MANUFACTURING MICROLENS ARRAY AND MICROLENS ARRAY

(75) Inventor: Nobuki Itoh, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 58 days.

(21) Appl. No.: 10/126,726

(22) Filed: Apr. 19, 2002

(65) Prior Publication Data

US 2002/0196563 A1 Dec. 26, 2002

(30) Foreign Application Priority Data

Apr. 20, 2001 (JP) ....................................... 2001-123440

(51) Int. Cl.[7] .............................................. B29D 11/00
(52) U.S. Cl. ..................... 264/1.38; 264/1.7; 156/99; 359/741; 359/362
(58) Field of Search ........................ 264/1.1, 1.7, 1.36, 264/1.38; 359/741, 362, 642; 156/60, 99; 427/162

(56) References Cited

U.S. PATENT DOCUMENTS 3,532,038 A 10/1970 Rottmann
5,235,463 A 8/1993 Broussoux et al.
5,498,444 A 3/1996 Hayes

FOREIGN PATENT DOCUMENTS

DE 197 26 644 12/1998
JP 4-50804 * 2/1992

OTHER PUBLICATIONS

Pan et al., "Cylindrical Plastic Lens Array Fabricated by A Micro Intrusion Process", Micro Electro Mechanical Systems, pp. 217–221 (1999).

European Search Report for EP 02 00 8858 dated Jul. 25, 2002.

* cited by examiner

Primary Examiner—Mathieu D. Vargot
(74) Attorney, Agent, or Firm—RatnerPrestia

(57) ABSTRACT

A method of manufacturing a microlens array comprising forming microlenses by dropping or injecting to a plurality of through holes formed on a substrate a liquefied lens material so as to dispose the lens material at each of the through holes, the lens material being curable and has a predetermined transmittivity and a predetermined viscosity.

16 Claims, 13 Drawing Sheets

(A)

(B)

(C)

(D)

(E)

(A)

(B)

(C)

(A)

(B)

(C)

(D)

Fig. 7
(A)
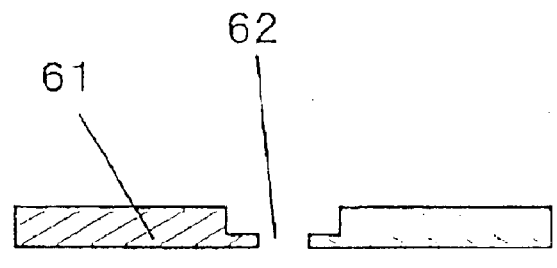
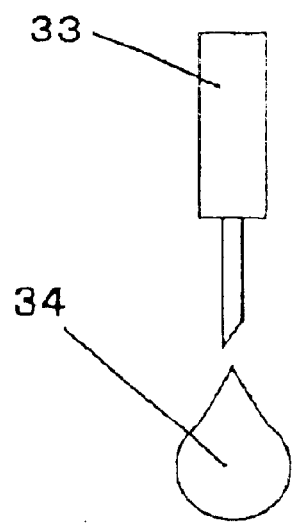
Fig. 7
(B)
Fig. 7
(C)
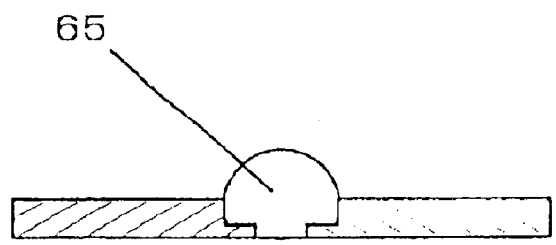

(A)

(B)

(A)

(B)

(C)

(A)

(B)

(A)

(B)

(A)

(B)

(C)

METHOD OF MANUFACTURING MICROLENS ARRAY AND MICROLENS ARRAY

BACKGROUND OF THE INVENTION

1. Field of the Invention

The present invention relates to a microlens array typically used in the fields of optical communication and optical packaging for coupling light emitted from a light source to an optical fiber or an optical waveguide, converting light emitted from the optical fiber or the optical waveguide into parallel rays or so focusing light beams to enter the optical fiber or the optical waveguide in an optical coupling system.

2. Related Art of the Invention

The microlens in general represents a fine lens having a lens diameter of not more than a several millimeters. Various methods relating to the microlens array including methods for manufacturing the same have been proposed in the art. The ion exchange diffusion method is widely known as a method for manufacturing the microlens array. In the ion exchange diffusion method, a dopant ion is selectively diffused on a multicomponent glass substrate.

The conventional ion exchange diffusion method will be described below with reference to FIGS. 14A to 14C. As shown in FIG. 14A, an ion exchange control membrane 102 is firstly formed on a surface of a multicomponent glass substrate 101 containing a monovalent ion. The ion exchange control membrane 102 may be a metal membrane or a dielectric membrane. Next, an array of circular apertures 103 at a predetermined pitch that is equivalent to that of an LD array or a PD array is formed on the ion exchange control membrane 102 using a photolithographic technique or a etching technique. The diameter of a lens prepared according to this method is determined by each of the apertures 103, and the apertures function as light-shielding membrans for reducing crosstalk between adjacent channels.

High temperature molten salt 104 shown in FIG. 14B containing a dopant ion that will contribute to ascending in refractive index. The dopant ion may include Tl, Ag and Pb, each having a high degree of refractive index. Then, the glass substrate 101 that is coated with the ion exchange control membrane 102 having the circular apertures 103 is immersed in the molten salt 104 so that the dopant ion is selectively diffused on the glass substrate 101 through the apertures 103 on the ion exchange control membrane 102 to thereby form ion exchange areas 105 each having a hemispheric diffusion front. The ion exchange areas 105 serve as distributed refraction type lenses according to a dopant ion distribution. Here, as a result of selecting the dopant ion having the ion radius that is larger than that of the ion contained in the glass substrate 101, the surface of the substrate 101 is expanded according to the volumetric difference between the ions to form convex lenses 106 shown in FIG. 14C. A diameter of each of the convex lenses 106 is typically in a range of from a several tens of microns to a several hundreds of microns.

The above-illustrated ion exchange diffusion method is suitable for forming a microlens having a diameter of from a several tens of microns to a several hundreds of microns; however, problems have been found with the method in manufacture of a microlens having a relatively large lens diameter or a lens effective diameter of from a several hundreds of microns to a several millimeters. More specifically, in order to prepare the relatively large microlens employing the ion exchange diffusion method, a depth of the diffusion must be a several hundreds of microns or more that is about the same as the size of the lens to be produced and it is necessary to conduct a heat treatment at a high temperature for a remarkably long time. Thus, in the ion exchange diffusion method, it is difficult to prepare lenses of a wide range of sizes having diameters from a several tens of microns to a several millimeters and, also, it is impossible to produce a microlens array having a focal length that is about the same as that of the diameter of the lens. Therefore, downsized and high-performance optical coupling elements have not been realized by the use of the ion exchange diffusion method.

SUMMARY OF THE INVENTION

In view of the above problems, an object of the present invention is to provide a method of manufacturing a microlens array that realizes downsized and high-performance optical coupling elements to be used in the fields of optical communication and optical packaging.

One aspect of the present invention is a method of manufacturing a microlens array comprising forming microlenses by dropping or injecting to a plurality of through holes formed on a substrate a liquefied lens material so as to dispose the lens material at each of the through holes, the lens material being curable and has a predetermined transmittivity and a predetermined viscosity.

Another aspect of the present invention is the method of manufacturing a microlens array, wherein a curvature of each of the microlens is varied by adjusting whole or part of (1) configurations or sizes of the through holes of the substrate, (2) wettability between the substrate and the lens material, (3) a viscosity of the lens material and (4) a quantity of lens material in a droplet or in an injection shot.

Still another aspect of the present invention is the method of manufacturing a microlens array, wherein the lens material is dropped or injected substantially simultaneously by using nozzles that can drop or inject the lens material substantially simultaneously to the through holes.

Yet still another aspect of the present invention is the method of manufacturing a microlens array, wherein the lens material is a ultraviolet ray curable resin material, a thermosetting resin material, a thermoplastic material or a glass material.

Still yet another aspect of the present invention is the method of manufacturing a microlens array according to 1st invention, wherein each of the through holes has a truncated conical shape or a step portion.

A further aspect of the present invention is the method of manufacturing a microlens array, wherein the microlenses are convex lenses.

A still further aspect of the present invention is the method of manufacturing a microlens array according to 1st invention, wherein the microlenses are concave lenses.

A yet further aspect of the present invention is the method of manufacturing a microlens array, wherein all refractive indexes and/or a transmittivities of the lens materials to be dropped or injected to the plurality of through holes are not same.

A still yet further aspect of the present invention is the method of manufacturing a microlens array, wherein a whole or a part of the plurality of through holes vary in size, and the lens material is dropped or injected in accordance with the sizes of the through holes.

An additional aspect of the present invention is the method of manufacturing a microlens array, wherein the plurality of through holes are arranged on the substrate to give a closest packed structure, each of the through holes having the shape of a hexagon of a predetermined size.

A still additional aspect of the present invention is the method of manufacturing a microlens array, wherein the substrate is formed from silicone, a plastic material, a glass material, ceramic material, fiber material or a composite material.

A yet additional aspect of the present invention is a microlens multilayer formed by laminating a plurality of microlens arrays produced by the method of manufacturing a microlens array according to any one of 1st to 11th inventions, wherein the plurality of microlens arrays are so laminated that optical axes of the microlenses of each microlens array coincide with the optical axes of the corresponding microlenses of another microlens array.

A still yet additional aspect of the present invention is a microlens array comprising a substrate in which a plurality of through holes are formed and a plurality of microlenses respectively disposed at the through holes in the substrate, wherein the microlenses are fixed to the through holes of the substrate by way of adhesion or deposition of a microlens material to a substrate material.

A supplementary aspect of the present invention is the microlens array, wherein the microlenses are formed of a ultraviolet ray curable resin material, a thermosetting resin material, a thermoplastic material or a glass material.

A still supplementary aspect of the present invention is the method of manufacturing a microlens array, wherein each of the through holes has a truncated conical shape or a step portion.

A yet supplementary aspect of the present invention is the method of manufacturing a microlens array, wherein the microlenses are convex lenses.

A still yet supplementary aspect of the present invention is the method of manufacturing a microlens array, wherein the microlenses are concave lenses.

Another aspect of the present invention is the method of manufacturing a microlens array, wherein all refractive indexes and/or a transmittivities of the lens material to be dropped or injected to the plurality of through holes are not same.

Still another aspect of the present invention is the method of manufacturing a microlens array, wherein a whole or a part of the plurality of through holes vary in size and a whole or a part of the microlenses vary in size in accordance with the sizes of the through holes.

Yet still another aspect of the present invention is the method of manufacturing a microlens array, wherein the plurality of through holes are arranged in the substrate to give a closest packed structure, each of the through holes having the shape of a hexagon of a predetermined size.

Still yet another aspect of the present invention is the method of manufacturing a microlens array, wherein the substrate is formed of any one of silicone, a thermoplastic material, a glass material, a ceramic material, a fiber material and a composite material.

A further aspect of the present invention is the method of manufacturing a microlens array, wherein each of the microlenses has a multilayer structure that consists of a plurality of layers varying in material and refractive index.

A still further aspect of the present invention is the method of manufacturing a microlens array, wherein each of the plurality of through holes in the substrate has a rectangular shape of a predetermined size and each of the microlenses that is formed by dropping has an anamorphotic or cylindrical configuration.

A yet further aspect of the present invention is the method of manufacturing a microlens array, comprising subjecting a surface of the substrate to an inactivating treatment so that a portion of the surface excluding the through holes has repelling properties to the lens material and the through holes have adhesive properties to the lens material.

A still yet further aspect of the present invention is the method of manufacturing a microlens array, wherein the surface of the substrate is caused to be uneven by the inactivating treatment.

BRIEF DESCRIPTION OF THE DRAWINGS

FIGS. 7A to 7C are illustrations for explaining a method of manufacture of a microlens array according to the fifth embodiment of the present invention.

Figure 1:
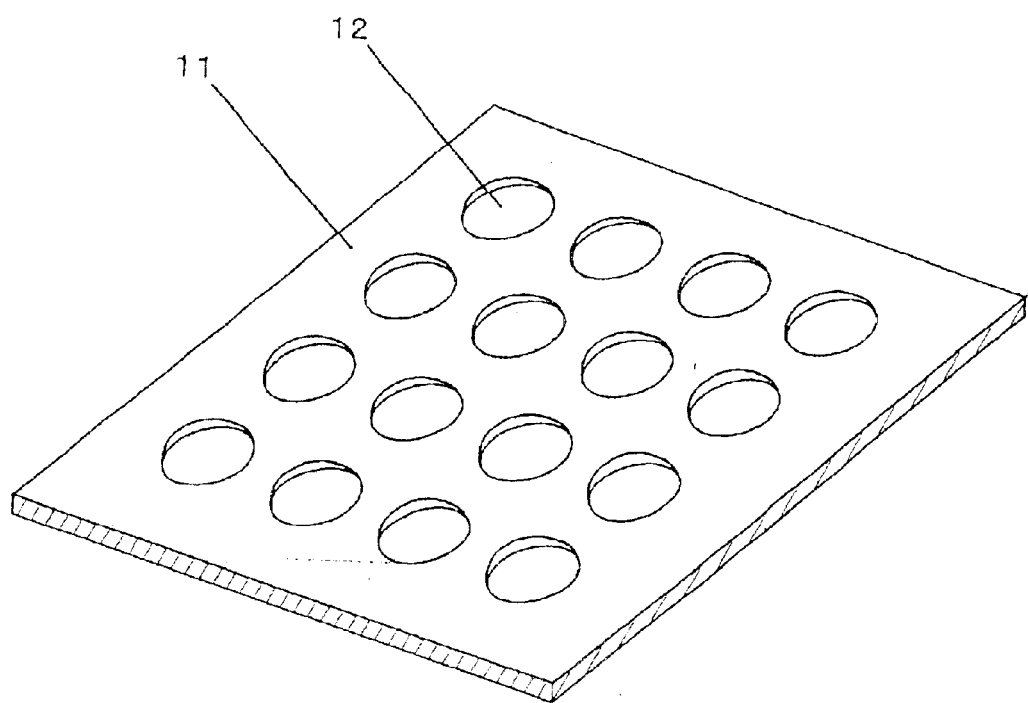
FIG. 1 is a perspective view showing a microlens array according to the first embodiment of the present invention.

REFERENCE NUMERALS 11, 31, 51, 61, 71, 81, 83, 85, 87, 91: substrates
32, 52, 62, 72: through holes
12, 35, 55, 56, 65, 73, 82, 84, 86, 88, 92, 93, 94, 95, 96, 97: lenses
33, 44: nozzles
101: multicomponent glass substrate
102: ion exchange control membrane 103: circular aperture
104: molten salt
105: ion exchange area
106: convex lens

PREFERRED EMBODIMENTS OF THE INVENTION

Preferred embodiments of the present invention will be described below with reference to FIGS. 1 to 14.

(First Embodiment)

FIG. 1 is a perspective view showing a microlens array according to a first embodiment of the present invention. As shown in FIG. 1, the microlens array in the first embodiment comprises a substrate 11 in which a plurality of through holes are provided and convex lenses 12 arranged on each of the through holes in the substrate 11, wherein a diameter of each of the convex lenses is from about a several tens of microns to about a several millimeters.

The convex lenses 12 have light transmitting properties and they are formed from a curable liquefied resin material or a thermoplastic material or a glass material that can be cured on the substrate 11.

Figure 2:
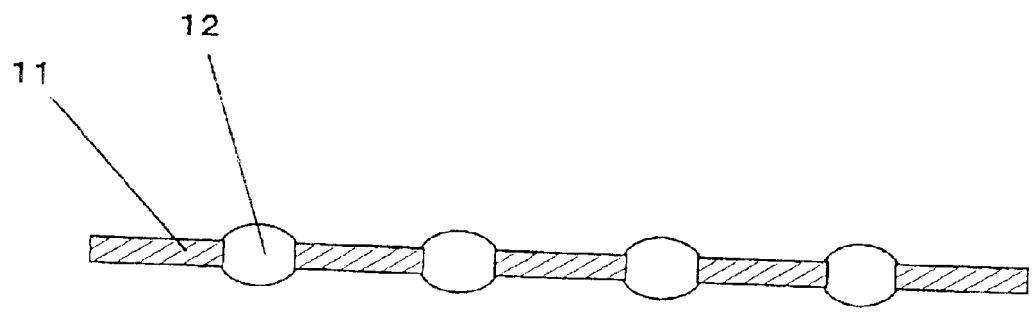
FIG. 2 is a cross-sectional view of the microlens array according to the first embodiment of the present invention.
Figure 3:
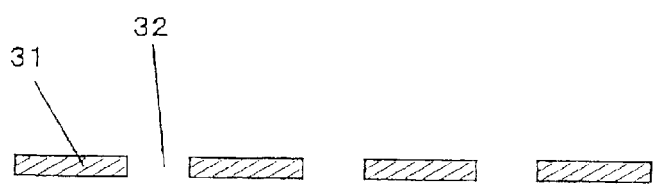
FIGS. 3A to 3E are illustrations for explaining a method of manufacture of a microlens array according to the second embodiment of the present invention.
Figure 3:
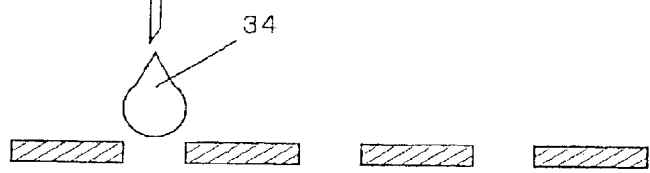
Figure 3:
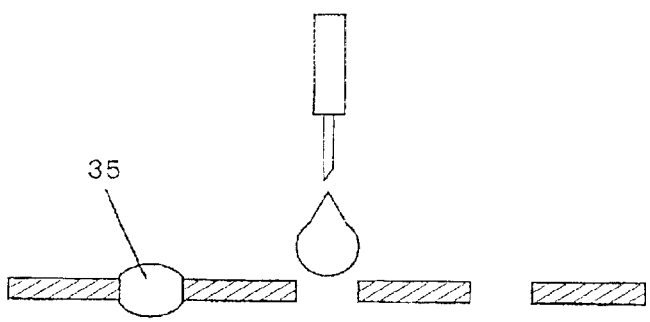
Figure 3:
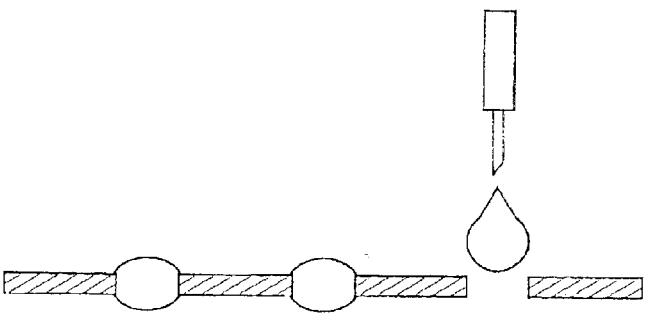
Figure 3:
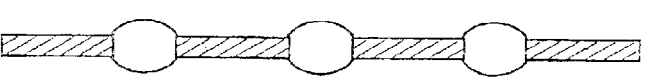
Figure 4:
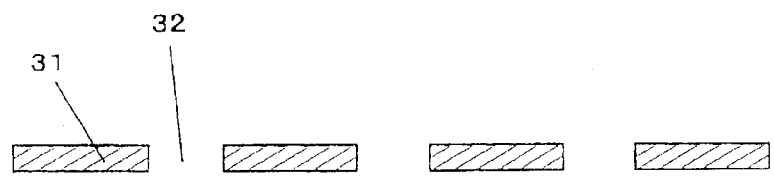
FIGS. 4A to 4C are illustrations for explaining a method of manufacture of a microlens array according to the third embodiment of the present invention.
Figure 4:
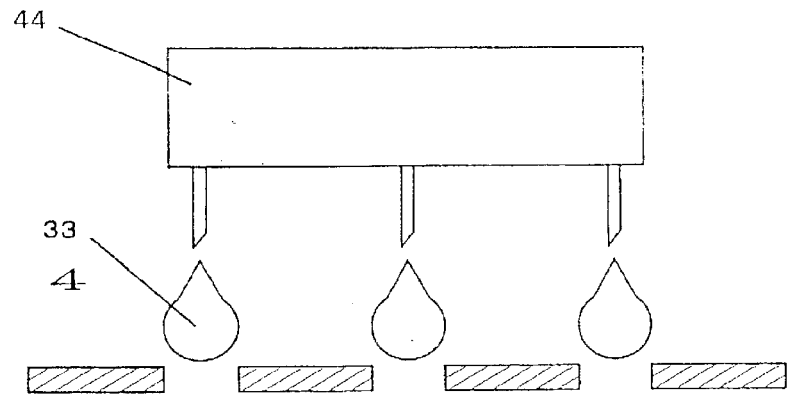
Figure 4:
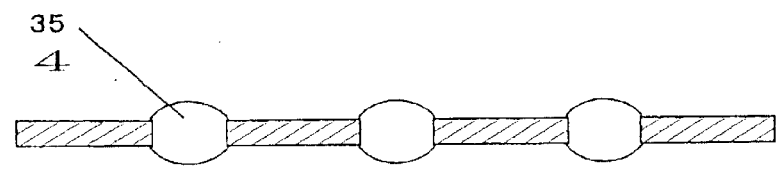
Figure 5:
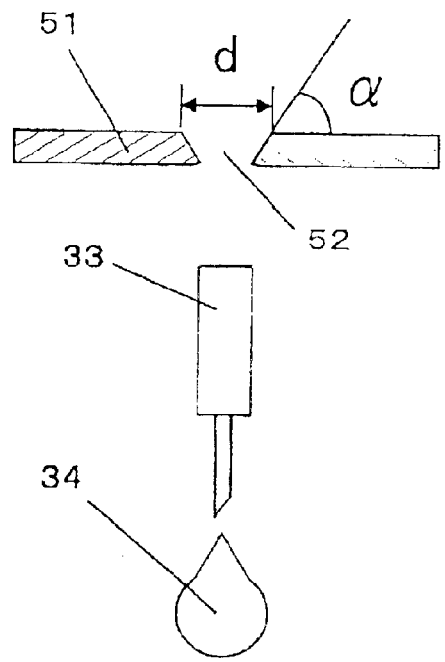
FIGS. 5A to 5D illustrations for explaining a method of manufacture of a microlens array according to the fourth embodiment of the present invention.
Figure 5:
Figure 5:
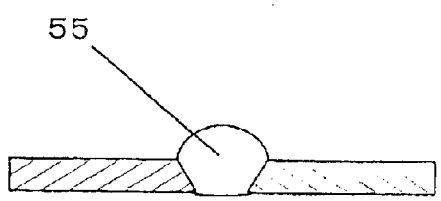
Figure 5:
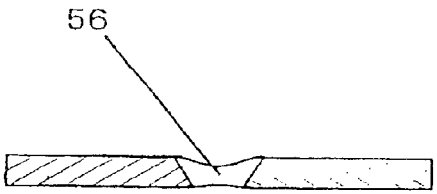
Figure 6:
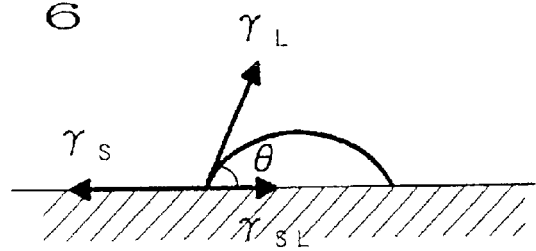
FIGS. 6A to 6D are cross-sectional views for explaining how a curvature of a lens can be changed by changing a configuration of a through hole according to an embodiment of the present invention.
Figure 6:
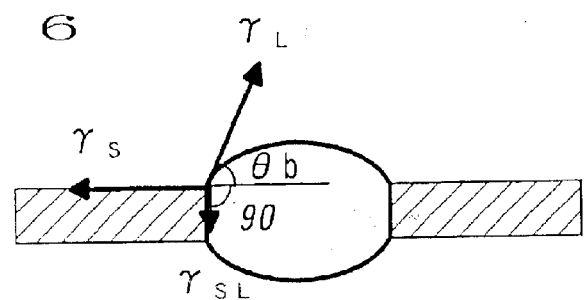
Figure 6:
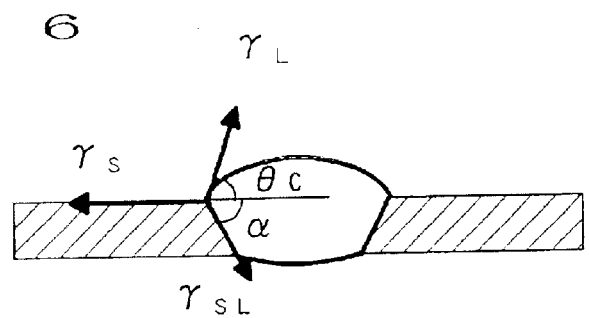
Figure 6:
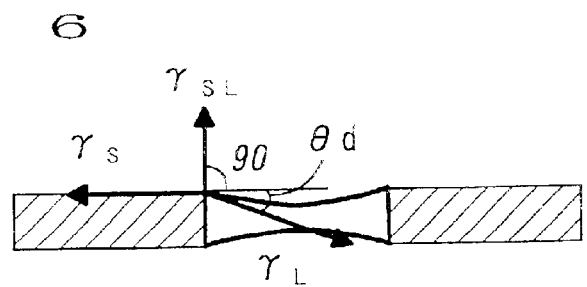

FIG. 2 is a cross-sectional view of the microlens array according to the first embodiment of the present invention described above with reference to FIG. 1, showing a state wherein the convex lenses are respectively disposed at the through holes on the substrate 11. As shown in FIG. 2, the lens material extends through the through holes above and below the substrate 11.

The microlens array according to the first embodiment is characterized in that a lens material, which is the resin material or the heated and liquefied plastic material or glass material described above, is dropped or injected to the through holes formed on the substrate 11 and that the convex lenses are disposed by taking advantages of a surface tension of the lens material. Further, positions of the convex lenses can be set arbitrarily depending on positions of the through holes disposed on the substrate 11.

Particularly, the positioning of the convex lenses 12 on the substrate 11 is facilitated by dropping or injecting the lens material to the through holes after forming the through holes on the substrate 11. The positions and sizes of the though holes can be defined arbitrarily by employing a fine processing technique according to the substrate material and, therefore, it is possible to form the through holes with a remarkably high degree of precision. Further, it is possible to control optical characteristics of the lenses by properly selecting the refractive index of the lens material. Moreover, it is possible to control a curvature of each of the lenses by adjusting a viscosity of the lens material before curing and an amount of drop or injection of the lens material to each of the through holes.

Thus, the microlens array according to the first embodiment of the present invention is characterized in that the positions and the optical characteristics of the lenses are controlled simultaneously and with a remarkably high degree of precision. Further, it is possible to form lenses of a wide range of effective diameters of from about a several tens of microns to about a several millimeters by adjusting a wettability, a viscosity and an amount of drop of the lens material to the substrate material.

The microlens array according to the first embodiment of the present invention is remarkably advantageous in terms of the optical coupling since the focal length is about the same as that of the diameter of each of the lenses and both surfaces of the lens are open to air without contacting the substrate material.

Thus, the material used for forming the substrate 11 of the microlens array according to the first embodiment of the present invention is not necessarily an optical material having light transmitting properties such as the plastic material or the glass material. More specifically, it is possible to form the microlens array if the substrate 11 is not formed from the optical material. In the case where the substrate 11 is formed from a material other than the optical material, the substrate 11 functions as an optical mask for the lenses to be formed on the substrate, thereby preventing stray lights from entering the lenses, which is remarkably effective in practical use.

(Second Embodiment)

FIGS. 3A to 3E are illustrations for a method of manufacturing microlens array according to a second embodiment of the present invention. The method of manufacturing microlens array of the second embodiment in the case of using a glass material for a substrate 31 and an adhesive resin material having light transmitting properties as a material for lenses 35 as shown in FIGS. 3A to 3E will be described in detail below.

As shown in FIG. 3A, through holes 32 are formed on a substrate 31 precisely by employing various fine processing techniques. The fine processing techniques to be employed may be an ultraprecise cutting, a laser processing, a focusing ion beam processing, a laser etching, a microdischarging, an electron beam writing.

Then, as shown in FIG. 3B, an adhesive material 34 is dropped from drop nozzles 33. A viscosity of the adhesive material 34 is so selected that the adhesive material stays in the through holes 32 without falling therefrom as shown in FIG. 3C. The viscosity and dropping amount must be selected properly to prevent the lens material 34 from falling from the through holes 32.

The adhesive resin material 34, which is the lens material, is dropped sequentially to the through holes disposed on the substrate as shown in FIG. 3D. The dropped adhesive resin material is then subjected to a heat curing or a ultraviolet ray curing method depending on characteristics of the resin to form convex lenses, thereby completing the production of microlens array shown in FIG. 3E. Epoxy-based adhesive resins or the like having light transmitting properties may be used as a thermosetting resin, while fluoridated epoxy-based resins or the like may be used as a ultraviolet ray curable resin.

(Third Embodiment)

A method of manufacturing microlens array according to a third embodiment of the present invention that is illustrated in FIGS. 4A to 4C will be described below. The process illustrated in FIGS. 4A to 4C is different from that illustrated in FIGS. 3A to 3E by a nozzle unit 44 that is formed by integrating a plurality of nozzles in order to shorten a time required for the production. By the use of such integrated dropping nozzles 44, a microlens array comprising the plurality of convex lenses can be two-dimensionally produced in a remarkably short period and effectively.

(Fourth Embodiment)

A method of manufacturing microlens array according to a fourth embodiment of the present invention that is illustrated in FIGS. 5A to 5D will be described below. The process illustrated in FIGS. 5A to 5D is different from that illustrated in FIGS. 4A to 4C in a tapered through hole 52 that is formed on a substrate 52. That is, the through hole has a truncated conical shape. The tapering of the through hole 52 makes it possible to control a curvature of a lens surface of a convex lens 55 that is formed on the through hole 52 by dropping a lens material 34 from a nozzle 33. In the case where a bottom diameter is fixed, it is possible to reduce the curvature of each of the lenses, i.e., to increase a convexity of each of the lenses, by increasing a tapering angle α. In turn, it is possible to form a concave lens shown in FIG. 5D by reducing the dropping amount.

As shown in FIGS. 5A to 5D, it is possible to change the curvature of the lens by changing a configuration of the through hole. Generally, in the case of dropping a liquid to a surface of a solid, "wet" means that the liquid spreads over the solid to cover its surface and "do not wet" means that the liquid does not spread but forms a spherical surface. The phenomenon of wetting varies considerably depending on properties of the surface of the solid and properties of the liquid.

As shown in FIG. 6A, a relationship among forces indicated by three arrows are in balance in the case where the liquid on the surface of the solid forms a spherical surface, and the forces are represented by the following Equation using Young's modulus.

$$\gamma_S = \gamma_{SL} + \gamma_L \cos\theta \quad \text{Equation 1:}$$

In Equation 1, $\gamma_S$ is a surface tension of the solid, $\gamma_{SL}$ is a surface tension of the liquid, $\gamma_L$ is an interfacial tension, and $\theta$ is a contact angle.

FIGS. 6B to 6D respectively show convex lenses formed on through holes, convex lenses formed on truncated conical through holes and concaved lenses formed on through holes. Hereinafter, a volume of each of the through holes of FIGS. 6B to 6D is indicated by Vb, Vc and Vd; a volume of the lens material dropped or injected to each of the through holes is indicated by Lb, Lc and Ld; and the contact angles of FIGS. 6B to 6D are respectively indicated by $\theta_B$, $\theta_C$ and $\theta_D$.

When Lb is larger than Vb, the convex lenses as shown in FIG. 6B are formed, and the following Equation holds.

$$\gamma_S = \gamma_L \cos\theta_B, \gamma_S = \gamma_L \sin\theta_B \quad \text{[Equation 2]}$$

When Lb is larger than Vb and each of the through holes has the truncated conical shape as shown in FIG. 6C, it is possible to form convex lenses each having a curvature different from that of the convex lenses of FIG. 6B, and the following Equation holds.

$$\gamma_S = \gamma_L \cos\theta_C + \gamma_{SL} \cos\alpha, \gamma_L \sin\theta_C = \gamma_{SL} \sin\alpha. \quad \text{[Equation 3]}$$

When Lb is equal to or smaller than Vb, the concaved lenses are formed as shown in FIG. 6D, and the following Equation holds. In this case, the direction of $\gamma_{SL}$ is considered to be transverse.

$$\gamma_S = Y_L \cos\theta_D, \gamma_{SL} = \gamma_L \sin\theta_D \quad \text{[Equation 4]}$$

Thus, it is possible to form both of the convex lenses and the concaved lenses by properly adjusting the viscosity, the wettability to the substrate material and the dropping amount of the lens material. Further it is possible to produce lenses each having a large numerical aperture (NA) since the curvature of lenses can be changed as described above.

A basic conception of adhesiveness according to the present invention will be described below. When water or alcohol is dropped on a surface of a solid that has a relatively large surface energy such as a clean glass or metal, the liquid wets completely the surface of the solid. When a solid-gas interfacial energy is $\gamma_{SG}$, a gas-liquid interfacial energy is $\gamma_{LG}$ and a solid liquid interfacial energy is $\gamma_{SL}$, the following Equation holds and the surface of the solid is not wet to repel the liquid.

$$\gamma_{SG} < \gamma_{LG} + \gamma_{SL} \quad \text{[Equation 5]}$$

When a liquid spreads over a surface of a solid, the phenomenon is called "spread wetting". To contrast, in the case where a liquid immerses into capillaries of a fiber or a paper, the phenomenon is called "immersional wetting". In turn, in the case of the present invention, a liquid adheres on a surface of a solid in the form of spheres, and the phenomenon is called "adhesive wetting".

The spread wetting occurs when water is dropped on a clean glass surface; however, it is possible to cause the adhesive wetting on the glass surface by subjecting the surface to a hydrophobication by using a cationic-activating agent. A change in a free energy ΔG with respect to each of the wettings is obtained by subtracting an interfacial energy that is lost by each of the wettings from an interfacial energy caused by each of the wettings. Particularly, the change in a free energy ΔG with respect to the adhesive wetting is represented by the following Equation.

$$\Delta G = \gamma_{SL} - \gamma_{SG} - \gamma_{LG} \quad \text{[Equation 6]}$$

Here, since Equation 1 can be rewritten into $\gamma_{SG} = \gamma_{SL} + \gamma_{LG} \cos\theta$ by using $\gamma_{SG}$ and $\gamma_{LG}$, Equation 6 can be modified as follows.

$$\Delta G = -\gamma_{LG}(1 + \cos\theta) \quad \text{[Equation 7]}$$

It is apparent from Equation 7 that the change in free energy with respect to the adhesive wetting can be represented as a coefficient for the surface tension of the liquid and a contact angle θ and it is possible to cause the adhesive wetting when Δ G is a positive integer. Accordingly, the adhesive wetting can occur irrespective of θ. However, a reduction in the free energy is relatively large and the wetting tends to occur if a value of θ is relatively small.

(Fifth Embodiment)

In order to control the lens curvature, it is possible to use through holes 62 each having a step-like profile in place of the tapered through holes. Examples of forming convex lenses 65 are described hereinbefore; however, it is possible to form not only the convex lenses but also concaved lenses and non-spherical lenses by adjusting the amount drop or injection of the lens material.

In the above embodiments, cases of using the adhesive resin material as the lens material for the microlenses composing the microlens array are described; however, it is also possible to use a plastic material, a glass material or the like as the lens material by changing the substrate material, the cure time and the dropping amount.

Cases of using the plastic material, glass material and so forth will be described below with reference to FIG. 3A to 3E. In the case of using a plastic as the material for the convex lenses, it is necessary to add to the nozzles 33 a function of heating the lens material to or over a predetermined temperature so that the plastic is liquefied. Also, in order to form the lenses without fail, it is necessary to heat the substrate 31 in advance so that the plastic material dropped or injected thereto is not solidified too rapidly by cooling. Further, in the case of using a glass material as the lens material, it is necessary to heat the glass material to or over a predetermined temperature before dropping or injecting the glass material from the nozzles 33. Also, in order to form the lenses without fail, it is necessary to heat the substrate 31 in advance so that the glass material dropped or injected thereto is not solidified too rapidly by cooling.

Also, it is possible to use a silicone substrate, a ceramic material, a plastic material, a fiber reinforced plastic, a fiber material such as a carbon fiber or a composite material composed of the above materials as the substrate material in place of the glass material. Examples of the fiber composite material include a glass fiber reinforced plastic (GFRP) that has widely been used. A composite material obtainable by combining high-performance and high-functional materials is called "advanced composite material" (ACM), and it is possible to use as the substrate material an ACM comprising a reinforcing material such as a high-performance carbon fiber, an aramid fiber and like inorganic fibers and a whisker as well as a matrix such as various high-performance resins, metals and ceramics.

(Sixth Embodiment 6)

Figure 8:
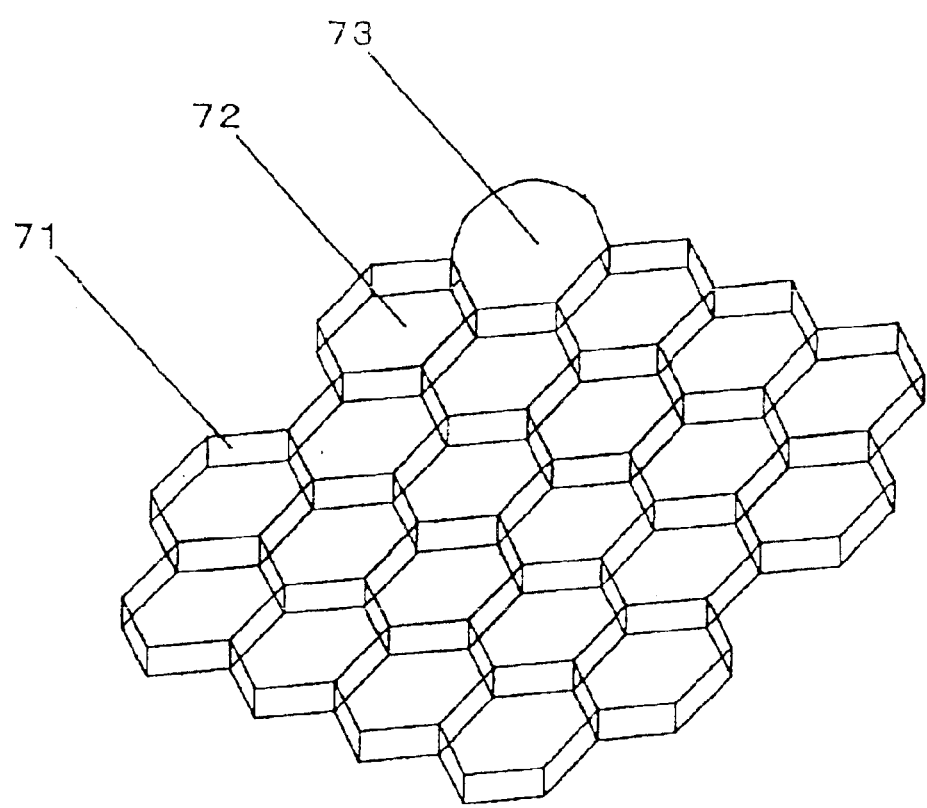
FIG. 8 is an illustration for explaining a method of manufacture of a microlens array according to the sixth embodiment of the present invention.
Figure 9:
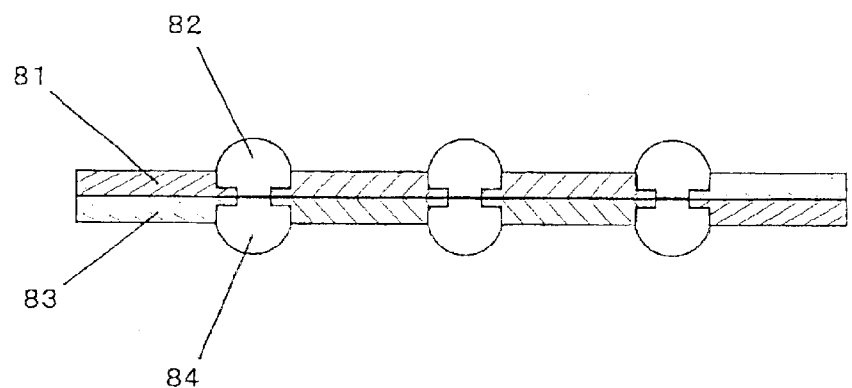
FIGS. 9A and 9B are illustrations for explaining a method of manufacture of a microlens array according to the seventh embodiment of the present invention.
Figure 9:
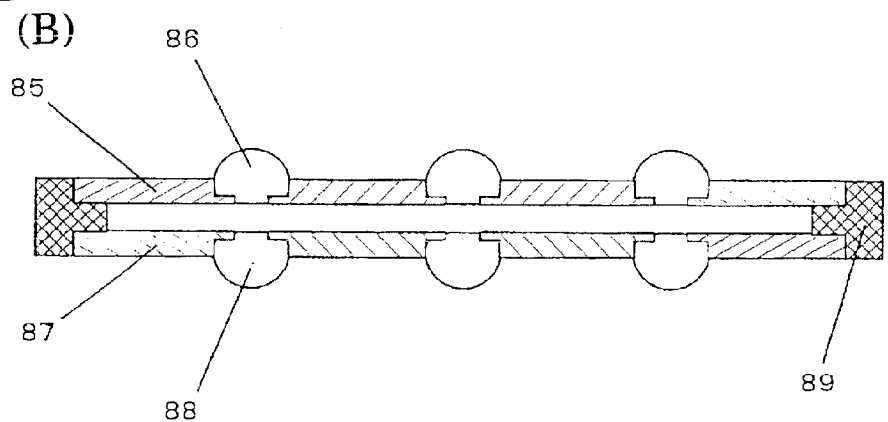
Figure 10:
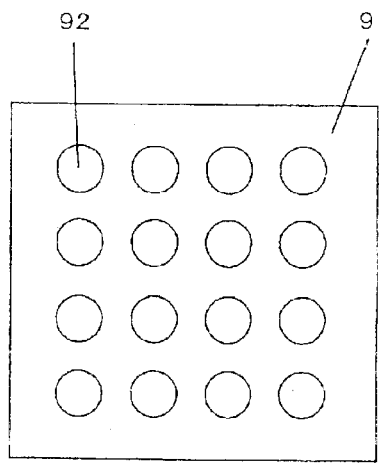
FIGS. 10A to 10D are patterns of a microlens array according to the eighth embodiment of the present invention.
Figure 10:
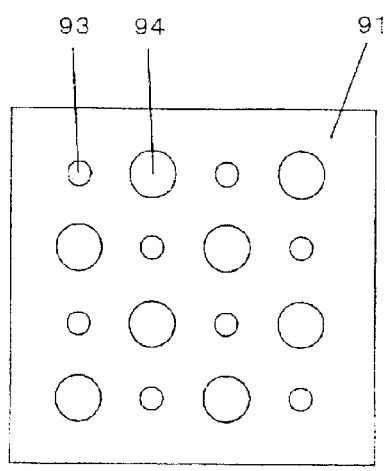
Figure 10:
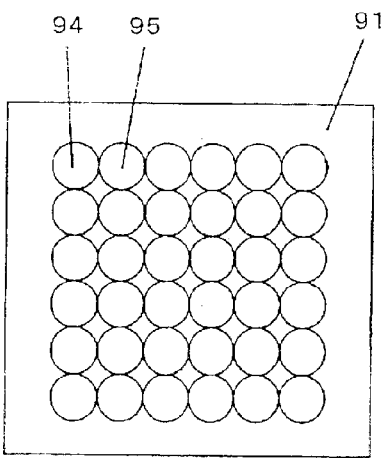
Figure 10:
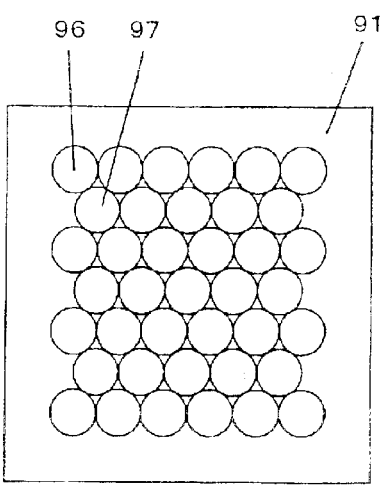
Figure 11:
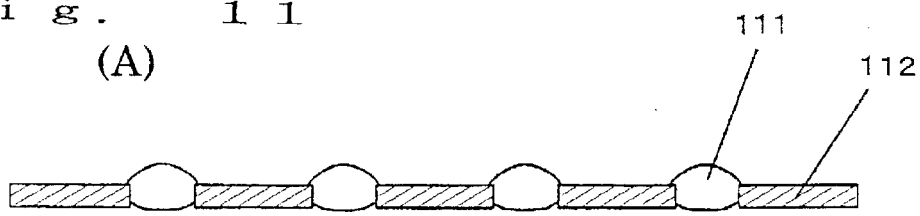
FIGS. 11A to 11C are illustrations for explaining a conventional method of manufacture of a microlens array.
Figure 11:
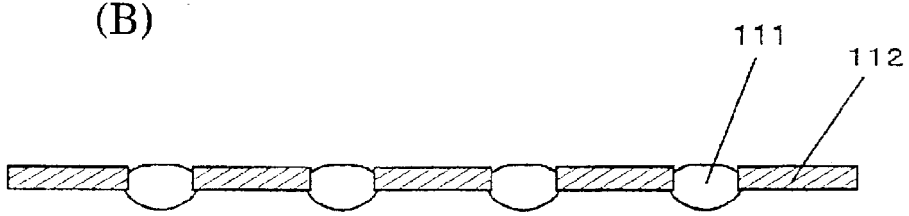
Figure 11:
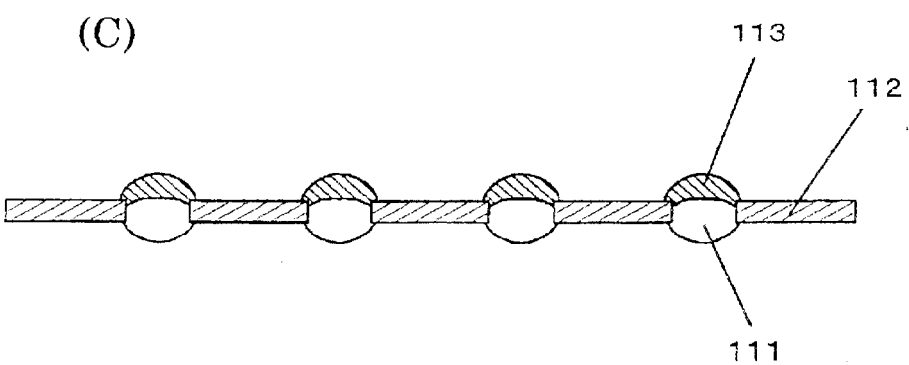
Figure 12:
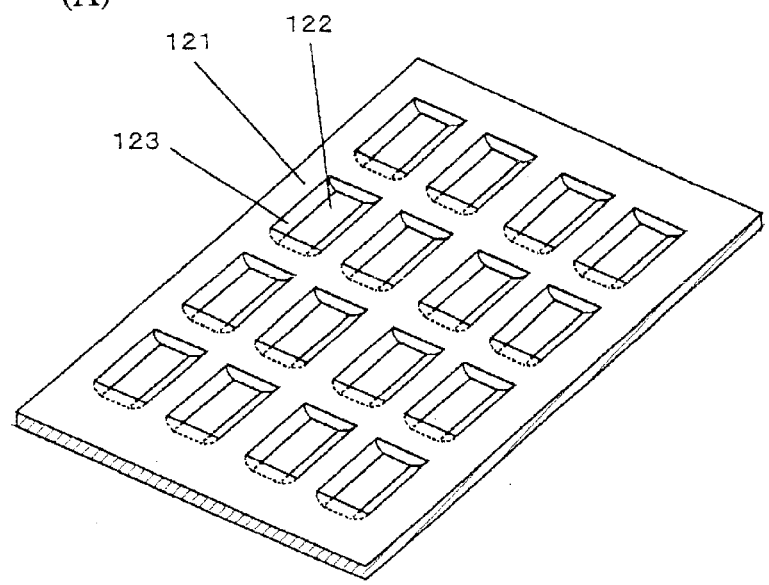
FIGS. 12A and 12B are illustrations for explaining a method of manufacture of a microlens array according to the tenth embodiment of the present invention.
Figure 12:
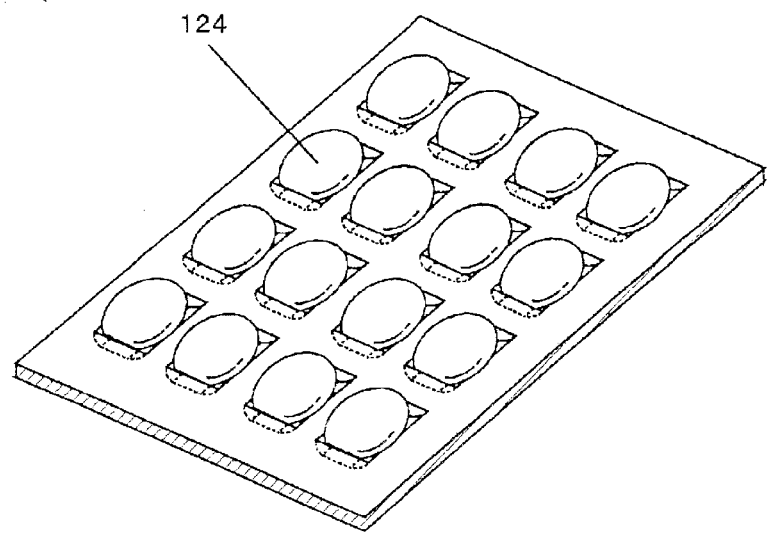
Figure 13:
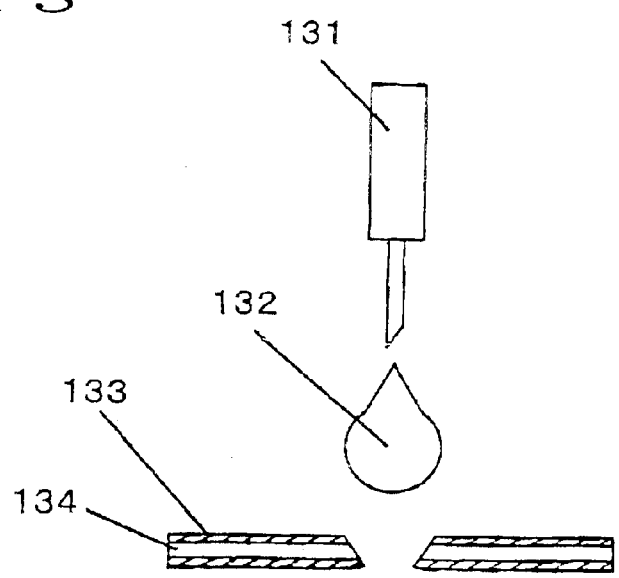
FIGS. 13A and 13B are illustrations for explaining a method of manufacture of a microlens array according to the eleventh embodiment of the present invention.
Figure 13:
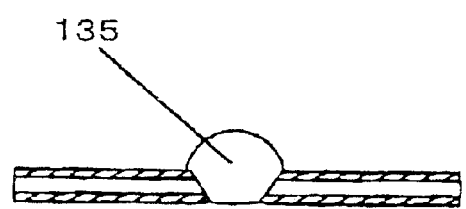
Figure 14:
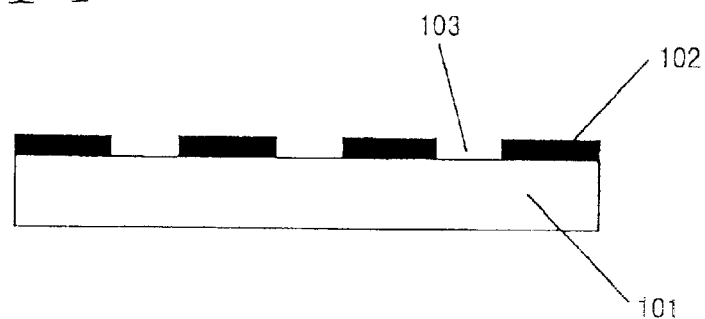
FIGS. 14A to 14C are illustrations for explaining a conventional method of manufacture of microlens array.
Figure 14:
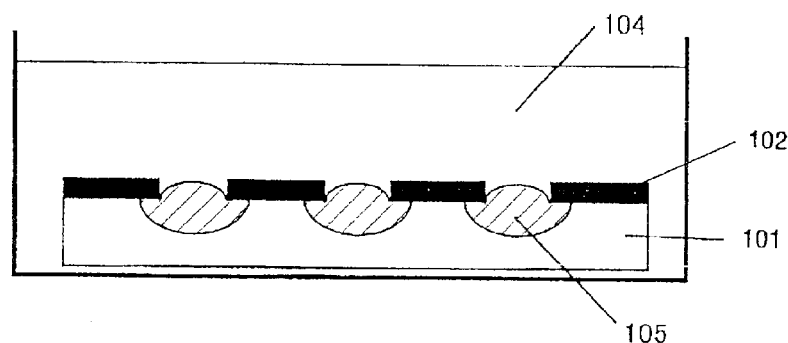
Figure 14:
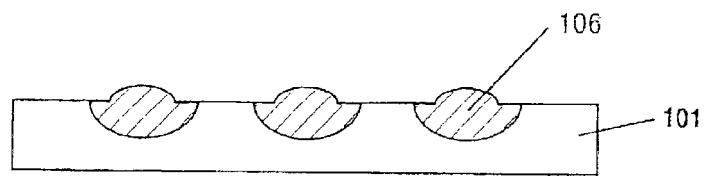

It is possible to produce a microlens array employing the production method described with reference to FIGS. 3A to 3E using a substrate 71 on which hexagon-shaped through holes 72 are formed as shown in FIG. 8, the substrate being formed from a flexible fiber material. Particularly in this case, it is possible to produce a flexible microlens sheet as a lens material to fill the through holes 72 to form lenses 73 by using a flexible resin material or a flexible plastic material having light-transmitting properties. Further, it is possible to manufacture a compound eye (similar to that of an insect which has a curved surface) image recognition device by so forming subminiature CCD elements that the CCD elements respectively correspond to the microlenses formed on the flexible microlens sheet.

A case of laminating two microlens arrays will be described below with reference to FIGS. 9A and 9B. FIG. 9A shows a state wherein two microlens arrays, on which the convex lenses are formed as described above, are laminated in such a manner that their back faces contact to each other and their optical axes coincide with each other. By laminating the two microlens arrays in the above-described manner, it is possible to enhance an optical coupling efficiency when used for the optical coupling. In order to further enhance the coupling efficiency, it is possible to use a spacer 89 to laminate the two microlens arrays. In this case, a distance between lenses can be adjusted by using the spacer 89 to further enhance the coupling efficiency. Also, by the use of the spacer 89, it is possible to produce a microlens array sheet by combining double-convex lenses varying in shape.

(Eighth Embodiment)

FIGS. 10A to 10D show production patterns of microlens array according to an eighth embodiment of the present invention. FIG. 10A shows a pattern wherein microlenses 92 that are identical in size are formed on a substrate 91 at a same pitch and a constant interval. The patterns are applicable to 1×N array lenses and N×N array lenses for the use as an optical interconnection for a parallel optical fiber transmission between chips, modules, boards and the like. Therefore, although the microlenses are typically formed at a pitch of 125 microns or 250 microns, it is possible to form the through holes at an arbitrary pitch.

Further, as shown in FIG. 10B, it is possible to form a combined array pattern of small diameter microlenses 93 and large diameter microlenses 94 for the use as an incident beam array whose light source or incident light has a sporadic beamform. The microlenses of arbitrary sizes that vary in diameter can be used in combination by adjusting processing sizes of the through holes to be formed on the substrate 91.

As shown in FIG. 10C, it is also possible to produce a lens array by shortening an interval between a microlens 94 and an adjacent microlens 95. Further, as shown in FIG. 10D, it is possible to dispose microlenses in the manner of fine fill disposition as shown in FIG. 8 by moving microlenses 96 of a first array and microlenses 97 of a second array. It is possible to further improve characteristics of the microlens array by forming a lens array by the use of a several types of lenses in combination in accordance with the properties of the light source and incident beam, the several types of lenses being those formed of lens materials that vary in optical properties i.e. refractive index and wavelength transmitting properties or those of different sizes.

(Ninth Embodiment)

A manufacturing method of microlens array according to a ninth embodiment of the present invention will be described with reference to FIGS. 11A to 11C. The process illustrated in FIGS. 11A to 11C is different from that illustrated in FIGS. 4A to 4C in lenses to be formed, i.e., composite lenses that vary in refractive index are formed in the process of FIGS. 11A to 11C. A plurality of spherical microlens arrays 111 is formed two-dimensionally as shown in FIG. 11A, and then the microlens array substrate is reversed as shown in FIG. 11B. After that, the composite lenses are formed by dropping the materials 113 that vary in refractive index as shown in FIG. 11C. Thus, it is possible to form the microlens array of composite refractive index by using the materials that vary in refractive index in combination. Accordingly, the lenses formed from the materials varying in refractive index function as achromatic lenses, thereby realizing microlenses capable of reducing chromatic aberration.

(Tenth Embodiment)

A manufacturing method of microlens array according to a tenth embodiment of the present invention will be described with reference to FIGS. 12A and 12B. The process illustrated in FIGS. 12A and 12B is different from that illustrated in FIGS. 5A to 5D in through holes, i.e., as shown in FIG. 12A, each of through holes 122 has a rectangular shape and long sides of each of the through holes 122 have tapering 123. Since the through holes have the rectangular shape and long sides thereof are tapered as described above, convex lenses formed on the through holes by dropping a lens material each having an oval curvature as lenses 124 shown in FIG. 12B. The oval lenses 124 thus formed function as anamorphotic lenses and capable of shaping a beam that is emitted from a semiconductor laser and asymmetric in lengthwise and crosswise to be symmetric, thereby enhancing coupling efficiency with an optical fiber or a light reception element to a remarkably high degree. In addition, although the anamorphotic lenses are shown in FIG. 12B, it is possible to form cylindrical lenses by modifying the shapes of through holes.

(Eleventh Embodiment)

A manufacturing method of microlens array according to an eleventh embodiment of the present invention will be described with reference to FIGS. 13A and 13B. The method illustrated in FIGS. 13A and 13B is different from that illustrated in FIGS. 5A to 5D in a substrate structure, i.e., the substrate structure shown in FIGS. 13A and 13b is a three layer structure formed by subjecting a surface of a solid substrate 134 that is relatively low in solid-liquid interfacial energy to an inactivating treatment to cause the adhesive wetting. By the three layer structure achieved by the inactivating treatment of the surface 133, a portion of the surface 133 at which through holes are not formed repels a lens material 135 to thereby contribute to fixing the lens material 135 in the through holes. Examples of the inactivating treatment include a method of increasing roughness by irradiating a solid surface with an electron beam and a method of coating a solid surface for inactivation. Other effective treatment may be sputtering, plasma CVD method, eximer laser irradiation, formation of a coating that is highly hydrophobic, formation of an oxide membrane with respect to metals, anodizing method with respect to metals, formation of fluoridated amorphous carbon membrane by the plasma CVD method, plating and the like. Thus, as a result of the surface treatment of the substrate surface as described above, the formation of the lenses is facilitated by the inactivation of the substrate with respect to the lens material to make it possible to form uniform lenses. In the case where the solid surface is a smooth surface and a contact angle of the lens material is 90 degrees or more, the smooth surface may be subjected to a roughing treatment to increase the contact angle. Accordingly, it is also possible to increase the adhesive wetting properties by forming fine convexoconcaves of a several microns or less on the smooth surface by a metal pattern processing, etc., thereby simplifying a formation of spherical lenses 135 on the through holes.

The substrate to be used for the above embodiments is not limited to the glass substrate, and a monocrystal silicone substrate, a ceramic substrate, a plastic substrate, a fiber substrate, a metal substrate or a composite substrate can be used depending on the lens material to be used. It is apparent that the microlens array is obtainable by using any one of the above substrates provided that the method for forming the through holes and the lens material are properly selected.

As described above, it is possible to arbitrarily change the size of the microlens of the present invention depending on the size of each of through holes to be formed on the substrate, and it is possible to produce the microlenses of a wide range of sizes each of which has a diameter from a several tens of microns to a several millimeters. It is possible to control optical properties of the microlens array by way of the lens material to be dropped or injected to the substrate, and each of the microlenses thus obtained is remarkably advantageous in terms of the optical coupling since both surfaces of each of the lenses are open to air without contacting the substrate material. Accordingly, the usage of the microlens array of the present invention is not limited to the optical communication elements, and it is possible to apply the microlens array to the optical packaging substrates and also, widely to image information processing devices and liquid crystal display devices, for the optical coupling, optical signal processing, light beam conversion and the like.

As is apparent from the above description, the present invention provides the microlens array that realizes downsized and high-performance optical coupling elements to be used in the fields of the optical communication, the optical packaging and the like and the method of manufacturing the same.

That is, according to the present invention, it is possible to produce a microlens array of a wide range of lens diameters remarkably easily. Also, according to the present invention, the lenses are disposed at arbitrary positions with both surfaces of each of the lenses being open to air without contacting the substrate material and they are remarkably high in precision. Thus, the present invention realizes the downsized and high-performance optical coupling elements.

What is claimed is:

1. A method of manufacturing a microlens array comprising dropping or injecting a liquefied lens material into a plurality of through holes formed on a substrate so as to dispose the lens material at each of the through holes, the lens material having a predetermined transmittivity and a predetermined viscosity, and curing the lens material within the substrate to form the microlens array with the lens material extending through the through holes above and below the substrate.

2. The method of manufacturing a microlens array according to claim 1, wherein a curvature of each of the microlens is varied by adjusting whole or part of (1) configurations or sizes of the through holes of the substrate, (2) wettability between the substrate and the lens material, (3) a viscosity of the lens material and (4) a quantity of lens material in a droplet or in an injection shot.

3. The method of manufacturing a microlens array according to claim 1, wherein the lens material is dropped or injected substantially simultaneously by using nozzles that can drop or inject the lens material substantially simultaneously to the through holes.

4. The method of manufacturing a microlens array according to claim 1, wherein the lens material is a ultraviolet ray curable resin material, a thermosetting resin material, a thermoplastic material or a glass material.

5. The method of manufacturing a microlens array according to claim 1, wherein each of the through holes has a truncated conical shape or a step portion.

6. The method of manufacturing a microlens array according to claim 1, wherein the microlenses are convex lenses.

7. The method of manufacturing a microlens array according to claim 1, wherein the microlenses are concave lenses.

8. The method of manufacturing a microlens array according to claim 1, wherein all refractive indexes and/or a transmittivities of the lens materials to be dropped or injected to the plurality of through holes are not same.

9. The method of manufacturing a microlens array according to claim 1, wherein a whole or a part of the plurality of through holes vary in size, and the lens material is dropped or injected in accordance with the sizes of the through holes.

10. The method of manufacturing a microlens array according to claim 1, wherein the plurality of through holes are arranged on the substrate to give a closed packed structure, each of the through holes having the shape of a hexagon of a predetermined size.

11. The method of manufacturing a microlens array according to claim 1, wherein the substrate is formed from silicone, a plastic material, a glass material, ceramic material, fiber material or a composite material.

12. The method of manufacturing a microlens array according to claim 1, wherein each of the microlenses has a multilayer structure that consists of a plurality of layers varying in material and refractive index.

13. The method of manufacturing a microlens array according to claim 1, wherein each of the plurality of through holes in the substrate has a rectangular shape of a predetermined size and each of the microlenses that is formed by dropping has an anamorphotic or cylindrical configuration.

14. The method of manufacturing a microlens array according to claim 1, comprising subjecting a surface of the substrate to an inactivating treatment so that a portion of the surface excluding the through holes has repelling properties to the lens material and the through holes have adhesive properties to the lens material.

15. The method of manufacturing a microlens array according to claim 14, wherein the surface of the substrate is caused to be uneven by the inactivating treatment.

16. A method of manufacturing a microlens multilayer array comprising:

providing a first substrate having a first plurality of first through holes;

providing a second substrate having a second plurality of second through holes;

dropping a liquefied lens material into the first plurality of first through holes formed on the first substrate;

curing the liquefied lens material, the cured lens material having an optical axis;

dropping a liquefied lens material into the second plurality of through holes formed on the second substrate so as to dispose the lens material at each of the through holes;

curing the liquefied lens material, the cured lens material having another optical axis;

aligning the first substrate to the second substrate so as to align the optical axes of the microlenses of the first substrate with the other optical axis of the second substrate; and forming the finished microlens multilayer array.

* * * * *